(12) United States Patent
Sun et al.

(10) Patent No.: US 11,889,645 B2
(45) Date of Patent: Jan. 30, 2024

(54) FOLDABLE ELECTRONIC DEVICE HAVING FOLDABLE DISPLAY

(71) Applicant: Acer Incorporated, New Taipei (TW)

(72) Inventors: Hui-Ping Sun, New Taipei (TW); Wei-Chih Wang, New Taipei (TW); Chun-Hung Wen, New Taipei (TW); Yu-Cheng Shih, New Taipei (TW); Yen-Chou Chueh, New Taipei (TW); Chi-Tai Ho, New Taipei (TW); Kuan-Lin Chen, New Taipei (TW); Chun-Hsien Chen, New Taipei (TW); Chih-Heng Tsou, New Taipei (TW)

(73) Assignee: Acer Incorporated, New Taipei (TW)

(*) Notice: Subject to any disclaimer, the term of this patent is extended or adjusted under 35 U.S.C. 154(b) by 0 days.

(21) Appl. No.: 17/953,352

(22) Filed: Sep. 27, 2022

(65) Prior Publication Data
US 2023/0016073 A1  Jan. 19, 2023

Related U.S. Application Data

(62) Division of application No. 16/843,833, filed on Apr. 8, 2020, now Pat. No. 11,503,728.

(30) Foreign Application Priority Data

Aug. 2, 2019 (TW) .................................. 108127553

(51) Int. Cl.
*H05K 5/02* (2006.01)
*H05K 5/00* (2006.01)
(Continued)

(52) U.S. Cl.
CPC .......... *H05K 5/0226* (2013.01); *E05D 3/122* (2013.01); *E05D 3/18* (2013.01); *G06F 1/1615* (2013.01);
(Continued)

(58) Field of Classification Search
CPC .. H05K 5/0226; H05K 5/0017; G06F 1/1615; G06F 1/1652; G06F 1/1681; E05Y 2900/606
See application file for complete search history.

(56) References Cited

U.S. PATENT DOCUMENTS 9,677,308 B1 * 6/2017 Chen ...................... G06F 1/1681
9,786,207 B2 * 10/2017 Kim ......................... G09F 9/301
(Continued)

*Primary Examiner* — Rockshana D Chowdhury
*Assistant Examiner* — Douglas R Burtner
(74) *Attorney, Agent, or Firm* — JCIPRNET

(57) ABSTRACT

A foldable electronic device includes a first casing, a second casing, a hinge structure and a foldable display. The hinge structure connects the first casing and the second casing, and includes a plurality of supporting blocks, a plurality of first hinge blocks and a plurality of second hinge blocks. The supporting blocks are arranged side by side between the first casing and the second casing. The first hinge blocks and the second hinge blocks are respectively arranged at two sides of the supporting blocks. One of the first hinge blocks connects two of the supporting blocks adjacent to each other. One of the second hinge blocks connects two of the supporting blocks adjacent to each other. The foldable display includes a first bonding portion secured to the first casing, a second bonding portion secured to the second casing and a foldable portion aligned to the hinge structure.

8 Claims, 10 Drawing Sheets

(51) Int. Cl.
  *E05D 3/18* (2006.01)
  *E05D 3/12* (2006.01)
  *G06F 1/16* (2006.01)

(52) U.S. Cl.
  CPC .......... G06F 1/1652 (2013.01); G06F 1/1681 (2013.01); H05K 5/0017 (2013.01); *E05Y 2900/606* (2013.01)

(56) References Cited

U.S. PATENT DOCUMENTS

| | | | | |
|---|---|---|---|---|
| 9,860,999 | B1* | 1/2018 | Hsu | E05D 3/06 |
| 9,874,048 | B1* | 1/2018 | Hsu | E05D 11/1028 |
| 9,898,051 | B2* | 2/2018 | Cho | G06F 1/1652 |
| 10,037,058 | B2* | 7/2018 | Kato | E05D 3/06 |
| 10,231,347 | B2* | 3/2019 | Seo | H05K 5/0017 |
| 10,386,894 | B2* | 8/2019 | Hsu | G06F 1/1681 |
| 10,401,917 | B1* | 9/2019 | Dai | H04M 1/022 |
| 10,429,896 | B2* | 10/2019 | Kuramochi | G06F 1/1681 |
| 10,545,541 | B1* | 1/2020 | Dighde | F16M 11/38 |
| 10,599,189 | B1* | 3/2020 | Hsu | G06F 1/1681 |
| 10,761,572 | B1* | 9/2020 | Siddiqui | G06F 1/1681 |
| 10,890,951 | B1* | 1/2021 | Watamura | E05D 11/0054 |
| 10,915,139 | B2* | 2/2021 | Park | G06F 1/1641 |
| 2014/0174226 | A1* | 6/2014 | Hsu | E05D 3/122 |
| | | | | 74/98 |
| 2015/0361696 | A1* | 12/2015 | Tazbaz | H04M 1/0268 |
| | | | | 361/679.27 |
| 2015/0378391 | A1* | 12/2015 | Huitema | H05K 1/183 |
| | | | | 361/679.03 |
| 2016/0239046 | A1* | 8/2016 | Park | G04G 17/04 |
| 2016/0370828 | A1* | 12/2016 | Hsu | G06F 1/1652 |
| 2016/0370829 | A1* | 12/2016 | Hsu | G06F 1/1652 |
| 2017/0227994 | A1* | 8/2017 | Hsu | E05D 3/06 |
| 2017/0277225 | A1* | 9/2017 | Yeom | G06F 1/1615 |
| 2017/0287385 | A1* | 10/2017 | Lian | G06F 1/1616 |
| 2018/0011515 | A1* | 1/2018 | Yoo | G06F 1/1652 |
| 2018/0059740 | A1* | 3/2018 | Kato | G06F 1/1681 |
| 2018/0275715 | A1* | 9/2018 | Park | G06F 1/16 |
| 2018/0275725 | A1* | 9/2018 | Lin | H04M 1/0268 |
| 2019/0034143 | A1* | 1/2019 | Wu | G06F 3/14 |
| 2019/0050023 | A1* | 2/2019 | Wu | A44C 5/0061 |
| 2019/0086965 | A1* | 3/2019 | Kuramochi | G06F 1/1652 |
| 2019/0145457 | A1* | 5/2019 | Hsu | F16C 11/04 |
| | | | | 16/368 |
| 2020/0042042 | A1* | 2/2020 | Park | H10K 77/111 |
| 2020/0225710 | A1* | 7/2020 | Pelissier | G06F 1/1637 |
| 2020/0348732 | A1* | 11/2020 | Kang | G06F 1/1652 |
| 2020/0409431 | A1* | 12/2020 | Fan | H04M 1/0268 |
| 2021/0011513 | A1* | 1/2021 | Watamura | G06F 1/1652 |
| 2021/0011523 | A1* | 1/2021 | Kuo | H04M 1/022 |
| 2021/0030123 | A1* | 2/2021 | Wu | H04M 1/0268 |
| 2021/0325941 | A1* | 10/2021 | Hou | H04M 1/0216 |
| 2022/0187874 | A1* | 6/2022 | Chun | G06F 1/1616 |

* cited by examiner

FOLDABLE ELECTRONIC DEVICE HAVING FOLDABLE DISPLAY

CROSS-REFERENCE TO RELATED APPLICATION

This application is a divisional application of and claims the priority benefit of U.S. application Ser. No. 16/843,833, filed on Apr. 8, 2020, now allowed, which claims the priority benefit of Taiwan patent application Ser. No. 108127553, filed on Aug. 2, 2019. The entirety of each of the above-mentioned patent applications is hereby incorporated by reference herein and made a part of this specification.

BACKGROUND

Field of the Disclosure

The present disclosure relates to an electronic device, and more particularly to a foldable electronic device.

Description of Related Art

With the development of display technology, the technology of foldable displays has become increasingly mature. In recent years, electronics manufacturers have been actively involved in the development and application of foldable displays. For example, in the case where a foldable display is integrated into a smart phone, a tablet PC or a notebook computer, the common designs of foldable display are the outward folded design in which the display surface of the foldable display is folded outwardly after folding and the inward folded design in which the display surface of the foldable display is folded inwardly after folding. However, most of the foldable displays have the problem of poor flatness after unfolding. Therefore, how to improve the flatness of the foldable display after unfolding has become an urgent issue to be solved.

SUMMARY OF THE DISCLOSURE

The disclosure provides a foldable electronic device, wherein the unfolded foldable display has good flatness.

The foldable electronic device of the present disclosure includes a first casing, a second casing, a hinge structure and a foldable display. The hinge structure is disposed between the first casing and the second casing, and connects the first casing and the second casing. The hinge structure includes a plurality of supporting blocks, a plurality of first hinge blocks, and a plurality of second hinge blocks. These supporting blocks are arranged side by side between the first casing and the second casing. The first hinge blocks are arranged on one side of the supporting blocks, wherein two of the adjacent supporting blocks are connected to each other through one of the first hinge blocks, and the first hinge blocks rotatably and slidably connect the supporting blocks. The second hinge blocks are arranged on the other side of the supporting blocks, wherein two of the adjacent supporting blocks are connected to each other through one of the second hinge blocks, and the second hinge blocks rotatably and slidably connect the supporting blocks. The foldable display includes a first bonding portion secured to the first casing, a second bonding portion secured to the second casing, and a foldable portion located between the first bonding portion and the second bonding portion, wherein the foldable portion is aligned with the hinge structure.

Based on the above, the hinge structure of the foldable electronic device of the present disclosure can be switched between a folded state and an unfolded state, and the foldable display can be folded or flatly unfolded by be driven through the hinge structure. Specifically, in the process of switching the hinge structure from the folded state to the unfolded state, the hinge structure generates movement in a horizontal direction, through which the foldable display is driven to be flatly unfolded so that the foldable display switched to the unfolded state has good flatness.

In order to make the aforementioned features and advantages of the disclosure more comprehensible, embodiments accompanying figures are described in detail below.

DESCRIPTION OF EMBODIMENTS

Figure 1A:
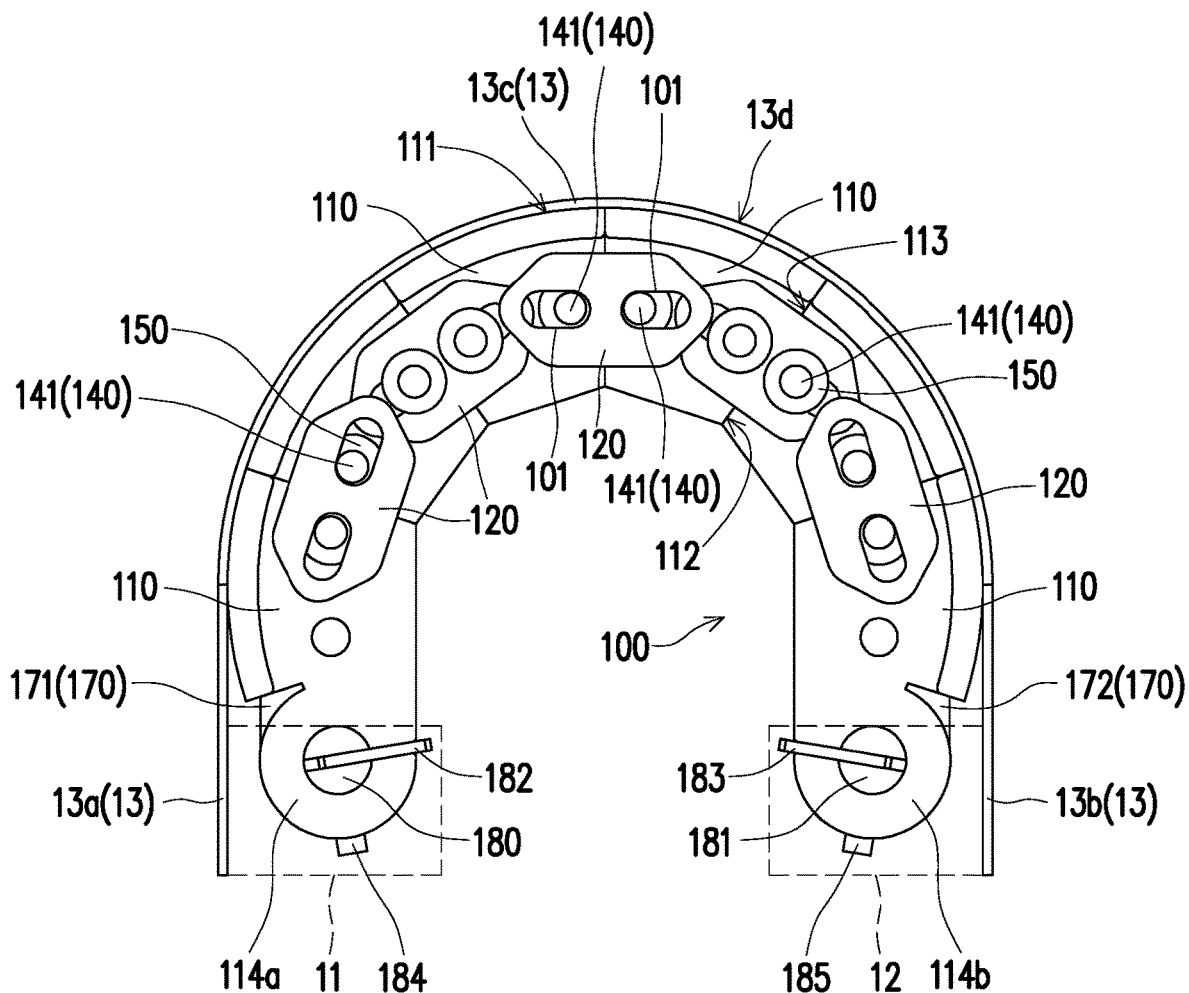
FIG. 1A is a schematic partial side view of a foldable electronic device in a bent and folded state according to an embodiment of the disclosure.
Figure 1B:
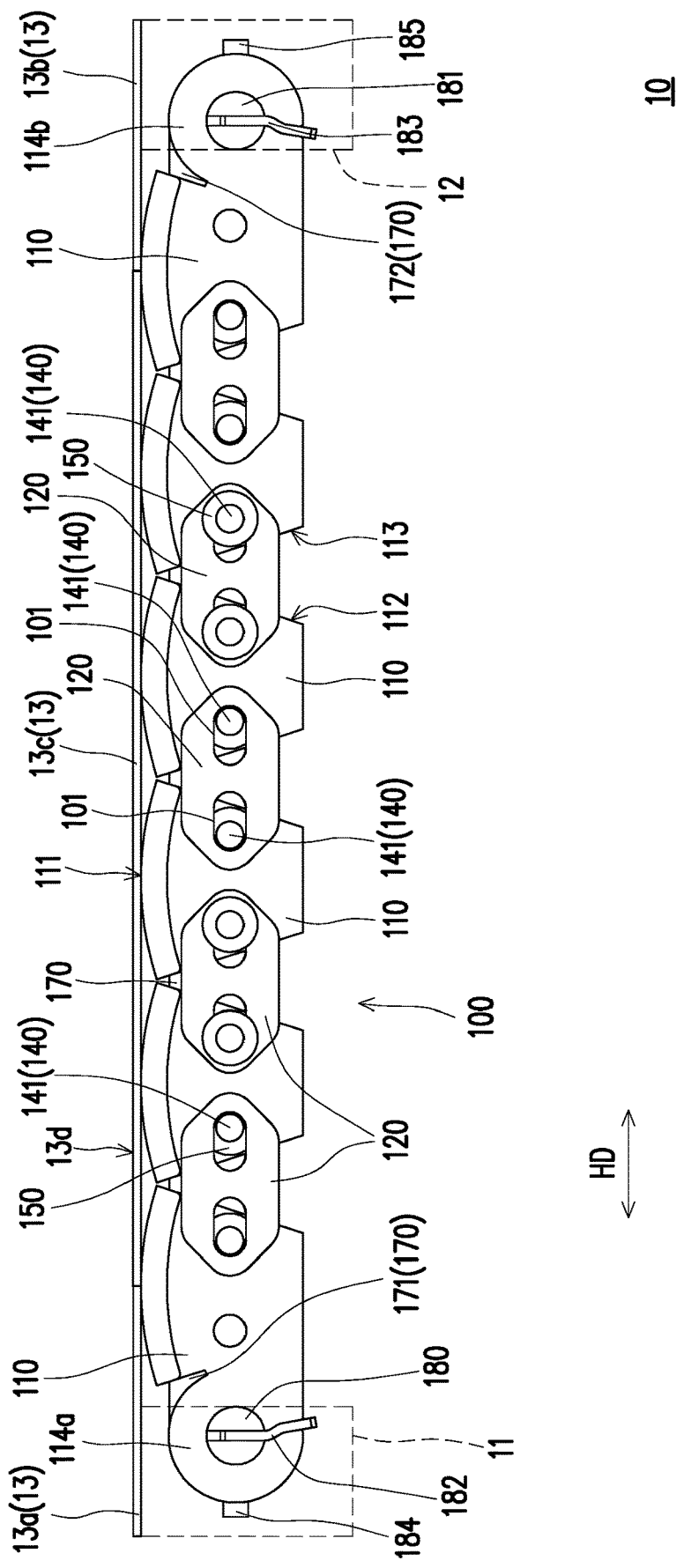
FIG. 1B is a schematic partial side view of the foldable electronic device of FIG. 1A switched to an unfolded state.
Figure 2A:
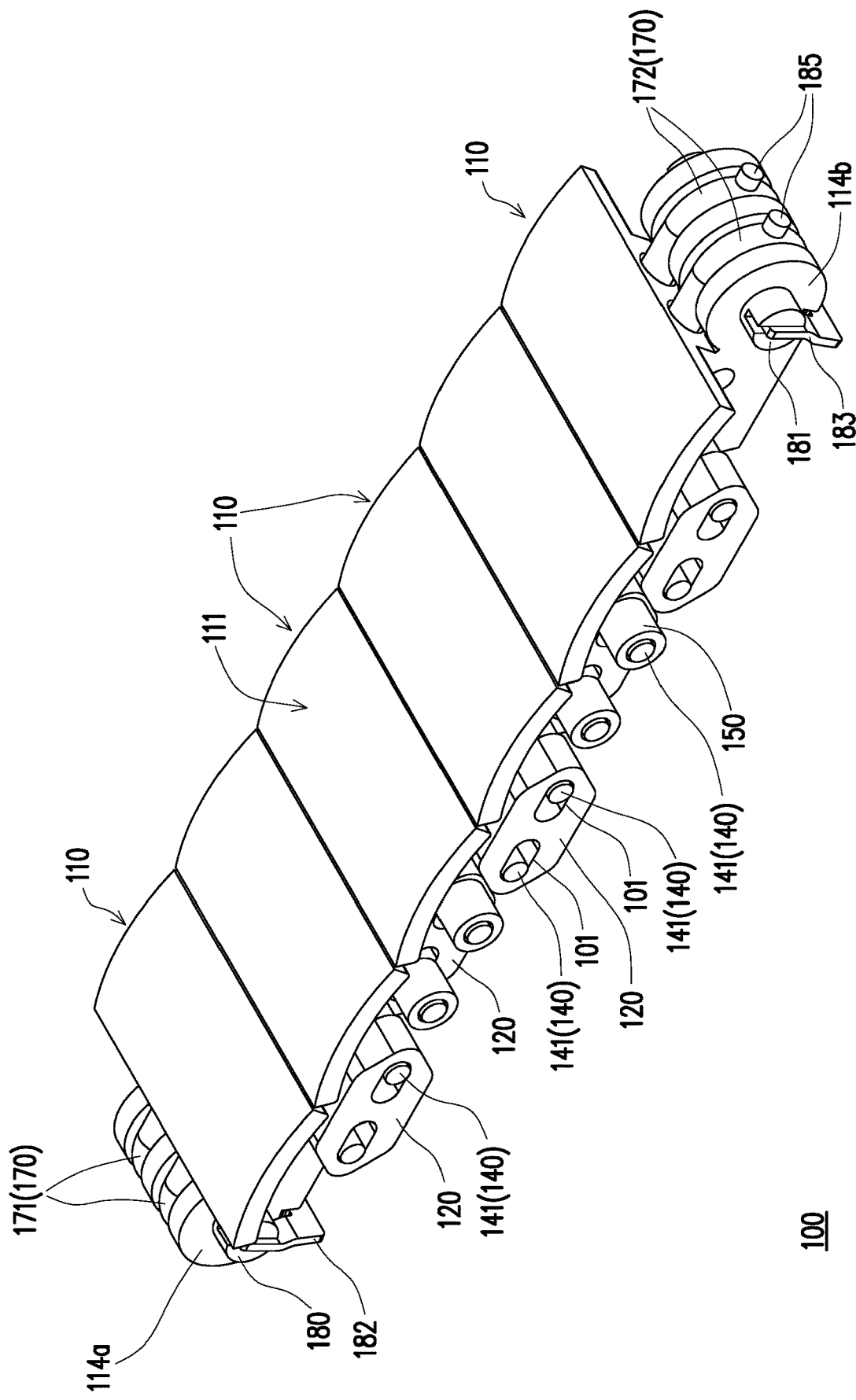
FIG. 2A is a schematic partial view of the hinge structure of FIG. 1B.
Figure 2B:
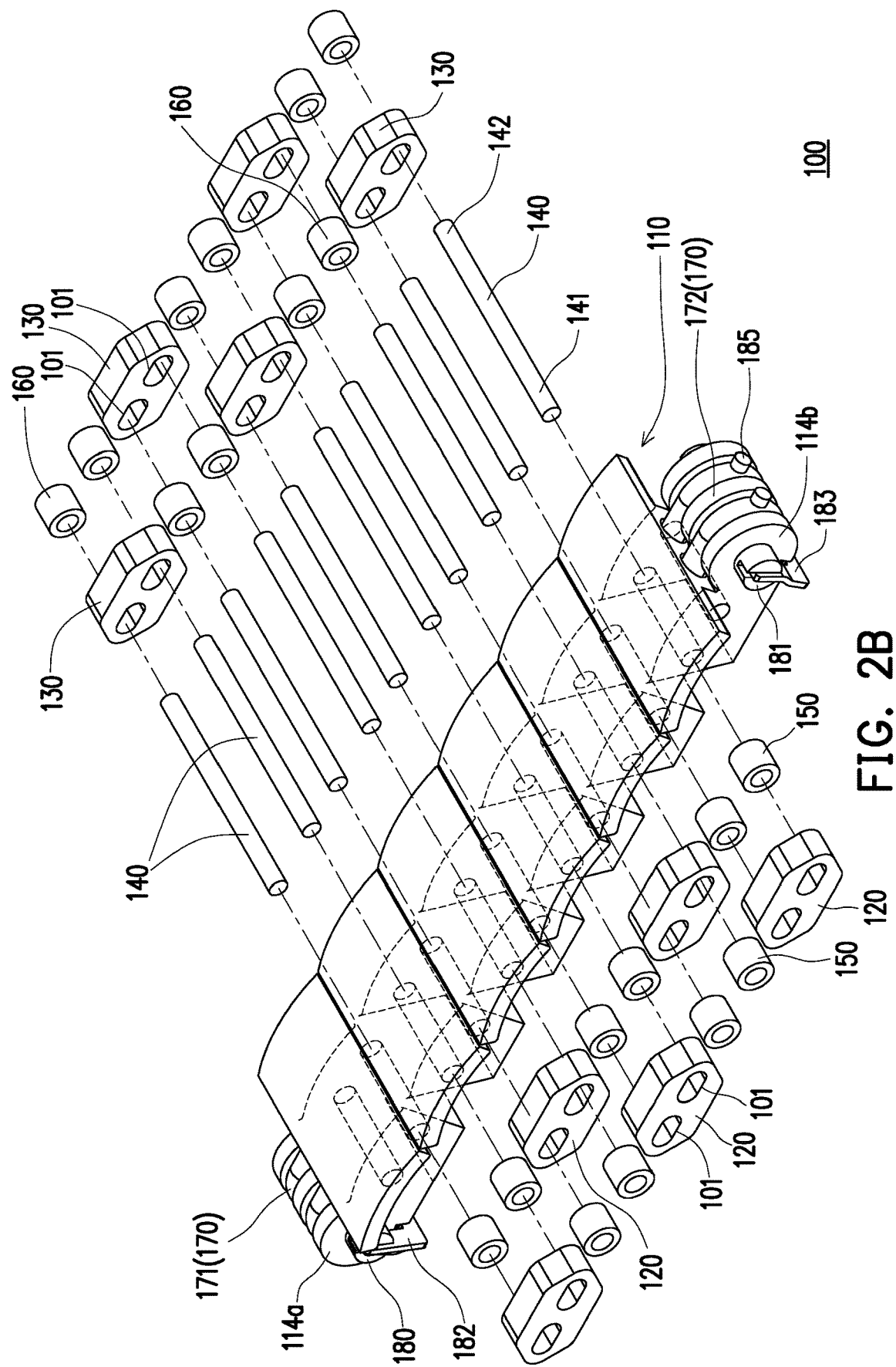
FIG. 2B is a schematic partial exploded view of the hinge structure of FIG. 2A.
Figure 2C:
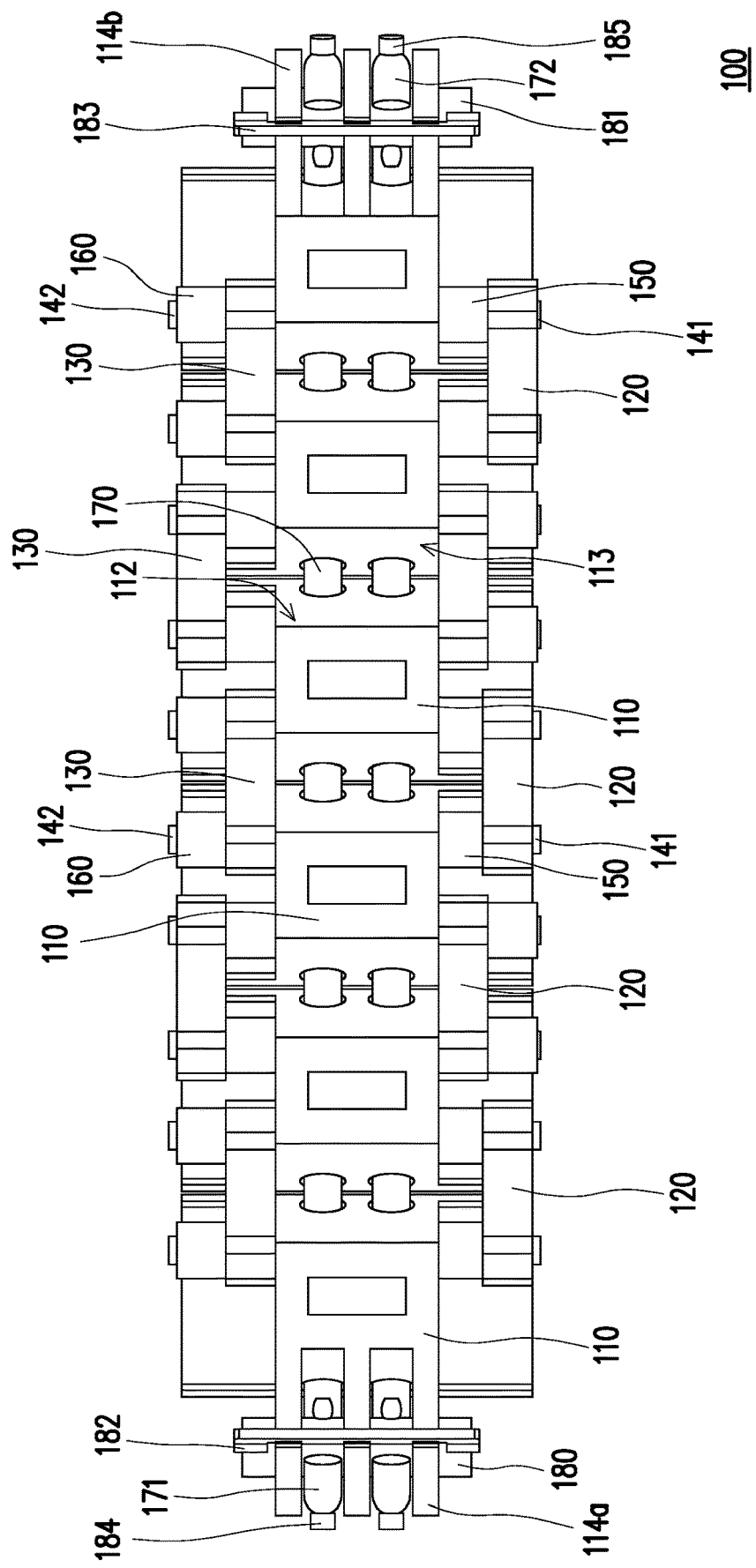
FIG. 2C is a schematic partial bottom view of the hinge structure of FIG. 2A.

FIG. 1A is a schematic partial side view of a foldable electronic device in a bent and folded state according to an embodiment of the disclosure. FIG. 1B is a schematic partial side view of the foldable electronic device of FIG. 1A switched to an unfolded state. FIG. 2A is a schematic partial view of the hinge structure of FIG. 1B. FIG. 2B is a schematic partial exploded view of the hinge structure of FIG. 2A. FIG. 2C is a schematic partial bottom view of the hinge structure of FIG. 2A. For convenience of illustration, the first casing 11 and the second casing 12 in the drawing are shown by dashed lines.

First, referring to FIG. 1A and FIG. 1B, in the embodiment, the foldable electronic device 10 can be integrated into a smart phone, a tablet computer, a notebook computer or a display, wherein the foldable electronic device 10 includes a first casing 11, a second casing 12, a foldable display 13 and a hinge structure 100, and the hinge structure 100 is disposed between the first casing 11 and the second casing 12. The hinge structure 100 is configured to connect the first casing 11 and the second casing 12, wherein the first casing 11 and the second casing 12 not only can be rotated relatively through the hinge structure 100 but also can be driven by the hinge structure 100 to generate movement in the horizontal direction HD.

Specifically, the foldable display 13 includes a first bonding portion 13a, a second bonding portion 13b, and a foldable portion 13c. The first bonding portion 13a is secured to the first casing 11, and the second bonding portion 13b is secured to the second casing 12. The foldable portion 13c is located between the first bonding portion 13a and the second bonding portion 13b, and is aligned with the hinge structure 100. For example, the foldable display 13 is designed to be folded outward, so that the foldable portion 13c is located right above the hinge structure 100, and the display surface 13d of the foldable display 13 always faces outward regardless of whether the foldable display 13 is in a folded state or an unfolded state.

As shown in FIG. 1A, the hinge structure 100 is in a folded state and has an arch-like structure. Since the foldable portion 13c is supported by the hinge structure 100, the foldable portion 13c is folded in conformity with the geometrical contour of the hinge structure 100. As shown in FIG. 1B, the hinge structure 100 is in an unfolded state, and has a beam-like structure. Since the foldable portion 13c is supported by the hinge structure 100, the foldable portion 13c is flatly unfolded in conformity with the geometrical contour of the hinge structure 100.

Further, during the transition of the hinge structure 100 from the folded state to the unfolded state, in the horizontal direction HD, the distance between both ends of the hinge structure 100 is gradually increased, and the distance between the first casing 11 secured to one of the two ends and the second casing 12 secured to the other end is also gradually increased. Accordingly, the foldable portion 13c is pulled by the first casing 11 and the second casing 12 to be flatly unfolded, so that the unfolded foldable display 13 has good flatness. Conversely, during the transition of the hinge structure 100 from the unfolded state to the folded state, in the horizontal direction HD, the distance between both ends of the hinge structure 100 is gradually reduced, and the distance between the first casing 11 secured to one of the two ends and the second casing 12 secured to the other end is also gradually reduced. Accordingly, the foldable portion 13c is squeezed by the first casing 11 and the second casing 12 and pushed by the hinge structure 100 to become folded.

Next, referring to FIG. 1A to FIG. 2C, in the present embodiment, the hinge structure 100 includes a plurality of supporting blocks 110, a plurality of first hinge blocks 120, and a plurality of second hinge blocks 130, wherein the supporting blocks 110 are arranged side by side between the first casing 11 and the second casing 12, and the first hinge blocks 120 and the second hinge blocks 130 are respectively arranged on both sides of the supporting blocks 110. Specifically, the number of the first hinge blocks 120 is equal to the number of the second hinge blocks 130, and the structural design of the first hinge blocks 120 is the same as the structural design of the second hinge blocks 130. The first hinge blocks 120 and the second hinge blocks 130 are arranged in a one-to-one configuration, and one of the first hinge blocks 120 and one of the second hinge blocks 130 disposed in pairs are configured to connect two of the adjacent supporting blocks 110.

Each of the first hinge blocks 120 can be roughly divided into two halves, wherein the two halves are respectively overlapped with the two adjacent supporting blocks 110, and the two halves rotatably and slidably connect the two adjacent supporting blocks 110 respectively. On the other hand, each of the second hinge blocks 130 can be roughly divided into two halves, wherein the two halves are respectively overlapped with the two adjacent supporting blocks 110, and the two halves rotatably and slidably connect the two adjacent supporting blocks 110 respectively. That is, the two adjacent supporting blocks 110 can be rotated and slid relative to each other through one of the first hinge blocks 120 and one of the second hinge blocks 130 arranged in pairs to move closer to or be separated from each other.

Each of the supporting blocks 110 has a supporting convex arc surface 111, and the foldable portion 13c of the foldable display 13 contacts the supporting convex arc surfaces 111 of the supporting blocks 110. As shown in FIG. 1A, the hinge structure 100 is in a folded state, and the supporting convex arc surfaces 111 of the supporting blocks 110 are joined into an arc surface. Since the foldable portion 13c is supported by the supporting convex arc surfaces 111 of the supporting blocks 110, the foldable portion 13c is folded in conformity with the arc surface formed by the supporting convex arc surfaces 111 jointed together.

The supporting block 110 of one of the two adjacent supporting blocks 110 has a first slope 112, and the other of the two adjacent supporting blocks 110 has a second slope 113 opposite to the first slope 112. On the other hand, the first slope 112 and the second slope 113 of each supporting block 110 are respectively connected to both sides of the supporting convex arc surface 111. In the unfolded state shown in FIG. 1B, the first slope 112 of one of the two adjacent supporting blocks 110 is separated from the second slope 113 of the other of the two adjacent supporting blocks 110, and the normal vector of the first slope 112 intersects with the normal vector of the second slope 113. In the folded state shown in FIG. 1A, the first slope 112 of one of the two adjacent supporting blocks 110 completely abuts against the second slope 113 of the other of the two adjacent supporting blocks 110, and the normal vector of the first slope 112 is parallel to the normal vector of the second slope 113.

That is, in the geometrical contour, the first slope 112 of one of the two adjacent supporting blocks 110 and the second slope 113 of the other of the two adjacent supporting blocks 110 match each other. Accordingly, after the hinge structure 100 is switched to the folded state, the supporting convex arc surfaces 111 can be joined to form an arc surface, so that the folded foldable portion 13c has a smooth curvature.

In this embodiment, each of the first hinge blocks 120 and each of the second hinge blocks 130 have two sliding slots 101 disposed symmetrically, and the movement route and the rotation route of the supporting blocks 110 are determined by the sliding slots 101 of the first hinge blocks 120 and the second hinge blocks 130. Specifically, the hinge structure 100 further includes a plurality of shafts 140, wherein the shafts 140 pass through the supporting blocks 110, and the two adjacent shafts 140 disposed in pairs respectively pass through the two adjacent supporting blocks 110. More specifically, each of the shafts 140 has a first end 141 and a second end 142 opposite to each other, wherein the first end 141 is for inserting into a sliding slot 101 of the first hinge block 120, and the second end 142 is for inserting into a sliding slot 101 of the second hinge block 130.

The two adjacent supporting blocks 110 are located between one of the first hinge blocks 120 and one of the second hinge blocks 130 disposed in pairs, and one of the first hinge blocks 120 and one of the second hinge blocks 130 disposed in pairs are configured to sleeve two adjacent shafts 140 disposed in pairs. In the two adjacent supporting blocks 110, the two first ends 141 of the two shafts 140 are inserted into the two sliding slots 101 of the first hinge block 120, and the two second ends 142 of the two shafts 140 are inserted into the two sliding slots 101 of the second hinge block 130. Specifically, the two adjacent supporting blocks 110 are connected to each other by a pair of two adjacent shafts 140 and a pair of first hinge block 120 and second hinge block 130. The supporting blocks 110 can be rotated and slid relative to each other through the engagement of the shafts 140 and the sliding slots 101.

Taking any of the first hinge blocks 120 or any of the second hinge blocks 130 as an example, in the folded state shown in FIG. 1A, the two shafts 140 are respectively located at the inner end of the two sliding slots 101. Conversely, in the unfolded state shown in FIG. 1B, the two shafts 140 are respectively located at the outer end of the two sliding slots 101. Specifically, one end of each of the sliding slots 101 close to the geometric center of the corresponding first hinge block 120 or the corresponding second hinge block 130 is regarded as an inner end, and the other end of each of the sliding slots 101 away from the geometric center of the corresponding first hinge block 120 or the corresponding second hinge block 130 is regarded as the outer end.

The hinge structure 100 further includes a plurality of first axle sleeves 150 and a plurality of second axle sleeves 160, wherein both ends of each of the shafts 140 are respectively sleeved with one of the first axle sleeves 150 and one of the second axle sleeves 160, and the first axle sleeves 150 and the second axle sleeves 160 can be used to provide the positioning torque for the shafts 140 to allow the hinge structure 100 to be temporarily fixed in the folded state, the unfolded state or a transition state between the folded state and the unfolded state. For example, a portion of the first axle sleeves 150 is located between a portion of the first hinge blocks 120 and the supporting blocks 110, and the other portion of the first hinge blocks 120 is located between the other portion of the first axle sleeves 150 and the supporting blocks 110. A portion of the second axle sleeves 160 is located between a portion of the second hinge blocks 130 and the supporting blocks 110, and the other portion of the second hinge blocks 130 is located between the other portion of the second axle sleeves 160 and the supporting blocks 110.

Specifically, one of the two adjacent second hinge blocks 130 contacts the two adjacent supporting blocks 110 through the two first axle sleeves 150, and the other of the two adjacent second hinge blocks 130 directly contacts the other two adjacent supporting blocks 110. That is, the two adjacent second hinge blocks 130 are misaligned with each other, so that the two adjacent second hinge blocks 130 do not collide each other due to rotation and sliding.

Referring to FIG. 1A to FIG. 2C, in the embodiment, two of the supporting blocks 110 are respectively connected to the first casing 11 and the second casing 12, wherein the supporting block 110 connected to the first casing 11 has a first connecting portion 114a, and the other supporting block 110 connected to the second casing 12 has a second connecting portion 114b. The hinge structure 100 further includes a reinforcing member 170, wherein the reinforcing member 170 may include two ropes, and the ropes may be made of metal, alloy, memory alloy or other materials with high strength and high robustness. The reinforcing member 170 passes through the supporting blocks 110, and the extending direction of the reinforcing member 170 may be perpendicular to the extending direction of the shafts 140. The reinforcing member 170 has a first fixing end 171 and a second fixing end 172 opposite to each other, wherein the first fixing end 171 is connected to the first connecting portion 114a, and the second fixing end 172 is connected to the second connecting portion 114b. The reinforcing member 170 can be used to connect and support the supporting blocks 110 to prevent the supporting blocks 110 in a folded state or an unfolded state from collapsing.

The hinge structure 100 further includes a first positioning pin 180, a second positioning pin 181, a first elastic member 182, a second elastic member 183, a third positioning pin 184, and a fourth positioning pin 185, wherein the first positioning pin 180 and the second positioning pin 181 respectively pass through the first connecting portion 114a and the second connecting portion 114b. The first fixing end 171 is wound around and secured to the first positioning pin 180, and the second fixing end 172 is wound around and secured to the second positioning pin 181. Specifically, the third positioning pin 184 is inserted into the first fixing end 171 and the first positioning pin 180 to secure the first fixing end 171 to the first positioning pin 180. The fourth positioning pin 185 is inserted into the second fixing end 172 and the second positioning pin 181 to secure the second fixing end 172 to the second positioning pin 181.

On the other hand, the first elastic member 182 is engaged with the first connecting portion 114a and the first positioning pin 180, and the second elastic member 183 is engaged with the second connecting portion 114b and the second positioning pin 181. During the transition of the hinge structure 100 from the folded state to the unfolded state or from the unfolded state to the folded state, in the horizontal direction HD, the distance between both ends (i.e., the first connecting portion 114a and the second connecting portion 114b) of the hinge structure 100 is increased or decreased, thereby driving the reinforcing member 170 to be elastically deformed, so that the length of the reinforcing member 170 is changed. During the elastic deformation (or the change in the length of the reinforcing member 170) of the reinforcing member 170, the first fixing end 171 drives the first positioning pin 180 to rotate relative to the first connecting portion 114a, and the second fixing end 172 drives the second positioning pin 181 to rotate relative to the second connecting portion 114b. The first positioning pin 180 in rotation can drive the first elastic member 182 to be elastically deformed, and the second positioning pin 181 in rotation can drive the second elastic member 183 to be elastically deformed. Accordingly, the elastic restoring force of the first elastic member 182 can provide the kinetic energy for the first positioning pin 180 to return, and the second elastic member 183 can provide the kinetic energy for the second positioning pin 181 to return, thereby compensating for the length difference between the folded state and the unfolded state of the reinforcing member 170.

Figure 3A:
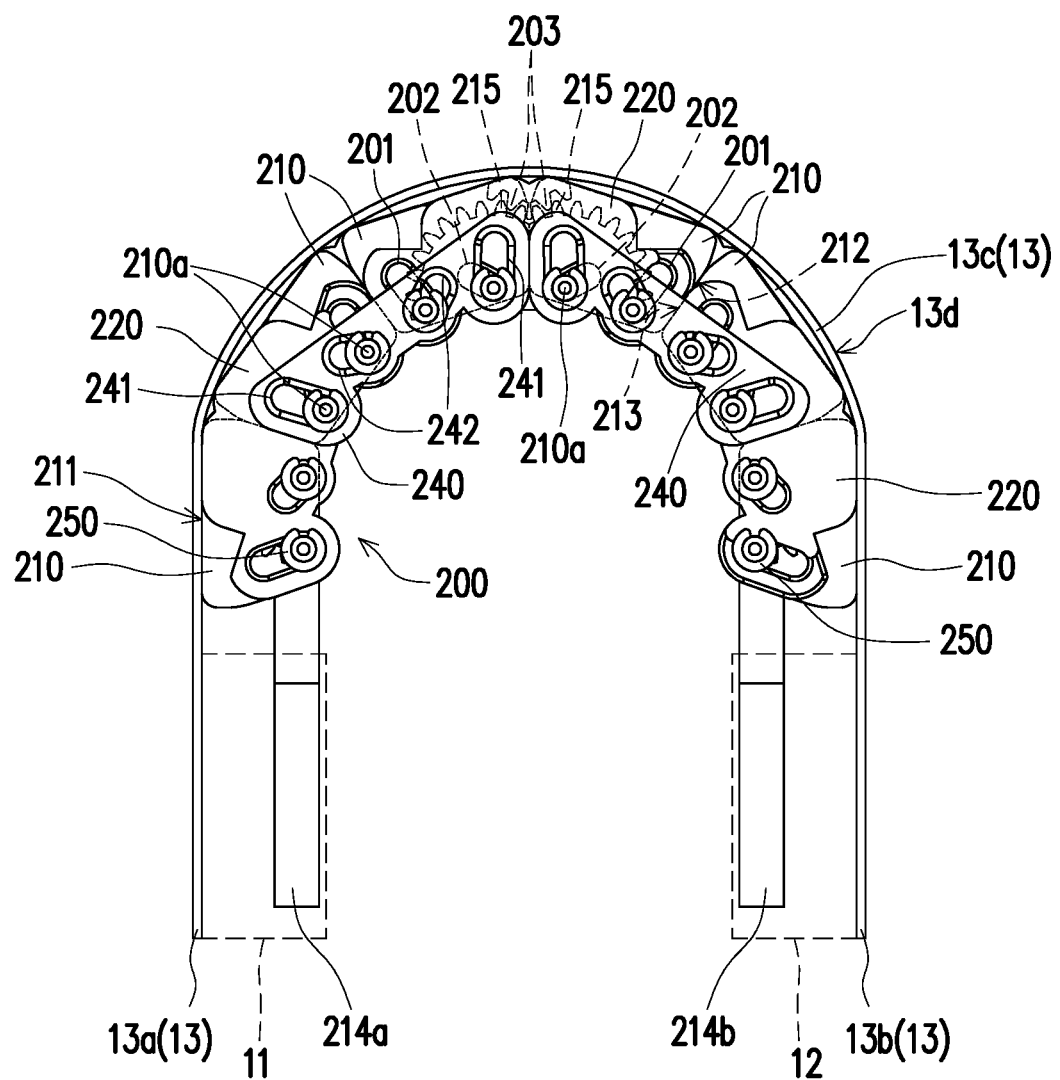
FIG. 3A is a schematic partial side view of the foldable electronic device in a bent and folded state according to another embodiment of the present disclosure.
Figure 3B:
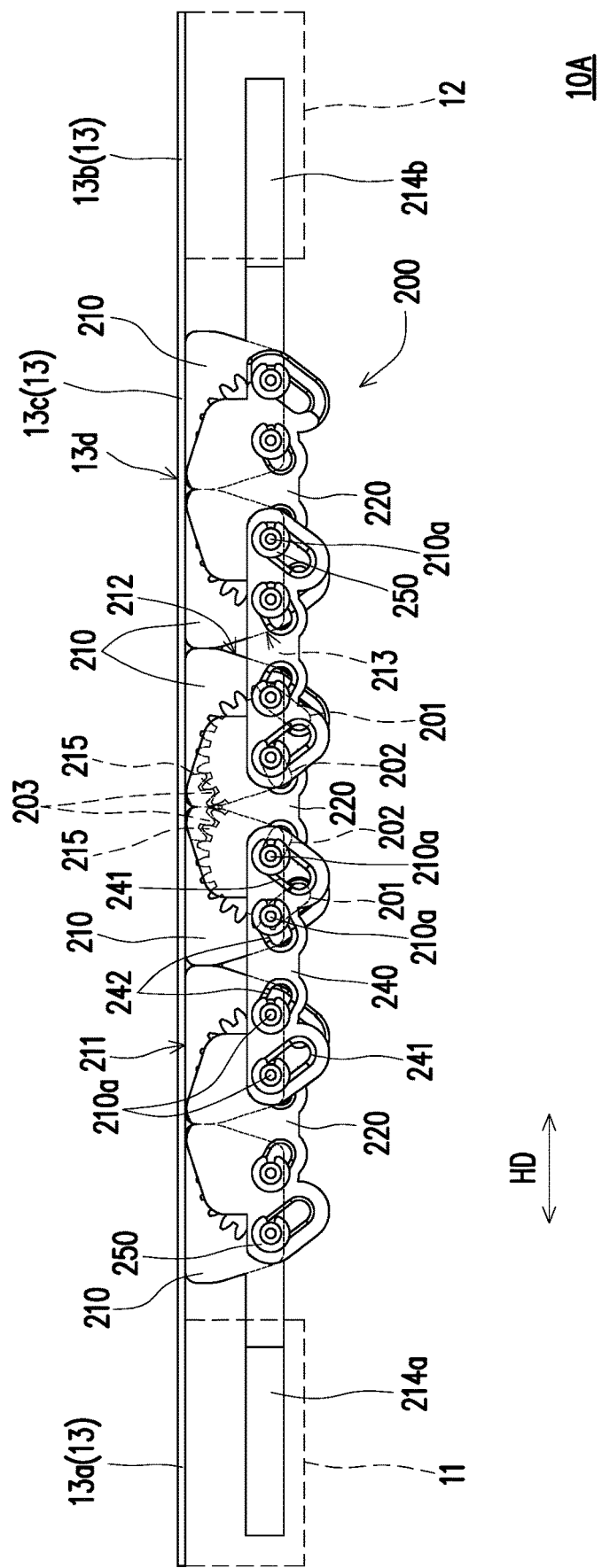
FIG. 3B is a schematic partial side view showing the foldable electronic device of FIG. 3A switched to the unfolded state.
Figure 4A:
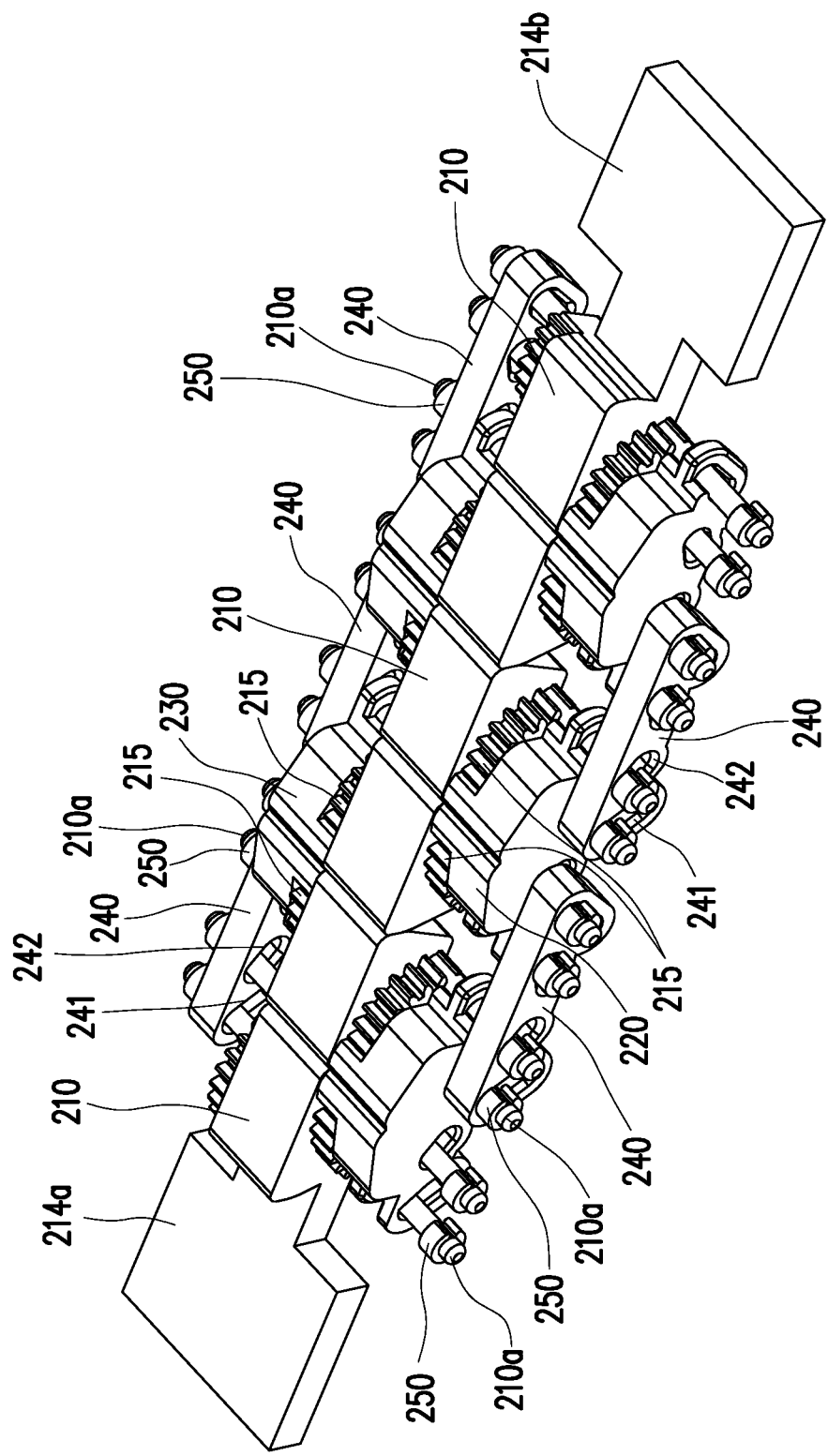
FIG. 4A is a schematic partial view of the hinge structure of FIG. 3B.
Figure 4B:
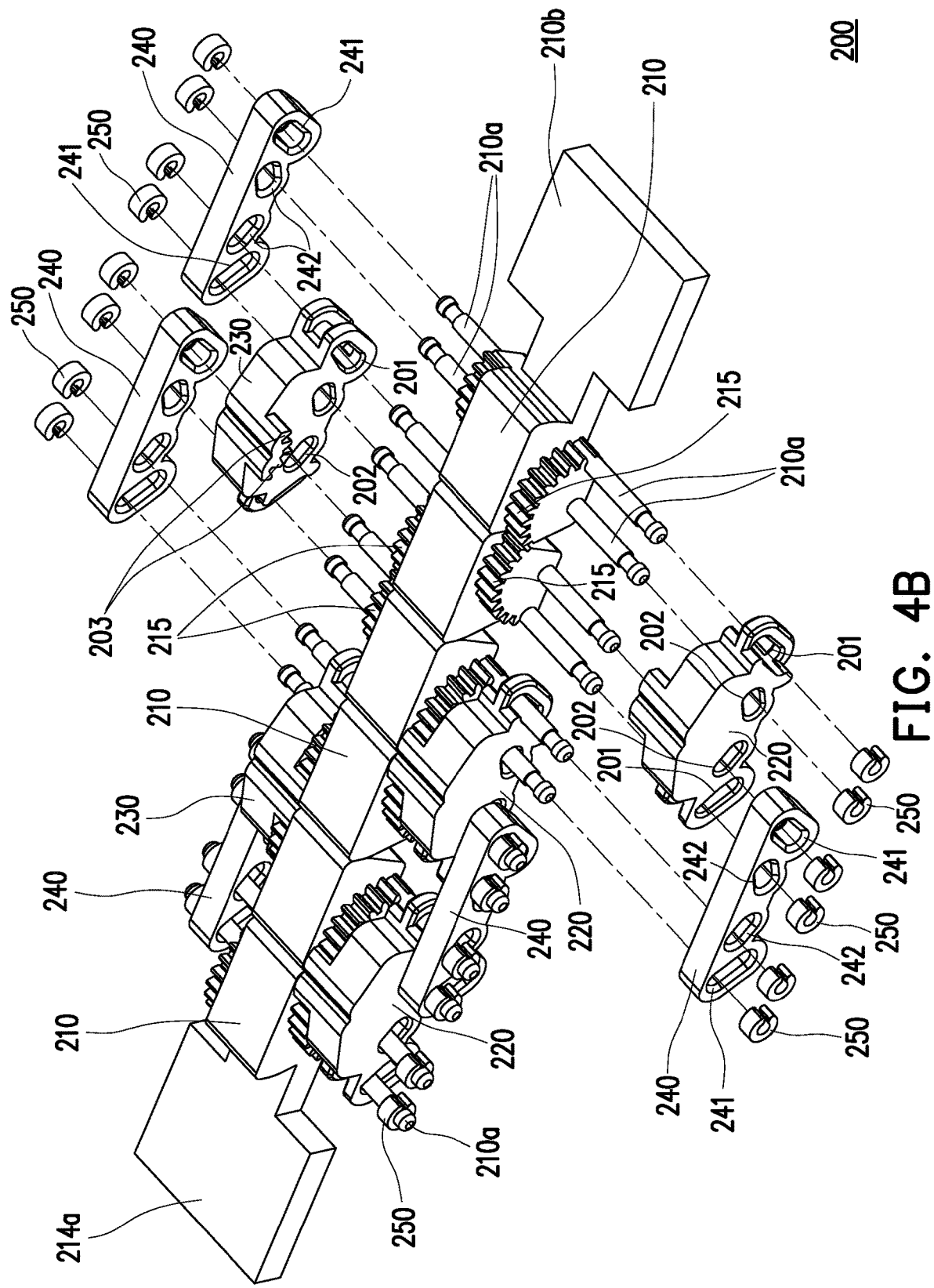
FIG. 4B is a schematic partial exploded view of the hinge structure of FIG. 4A.
Figure 4C:
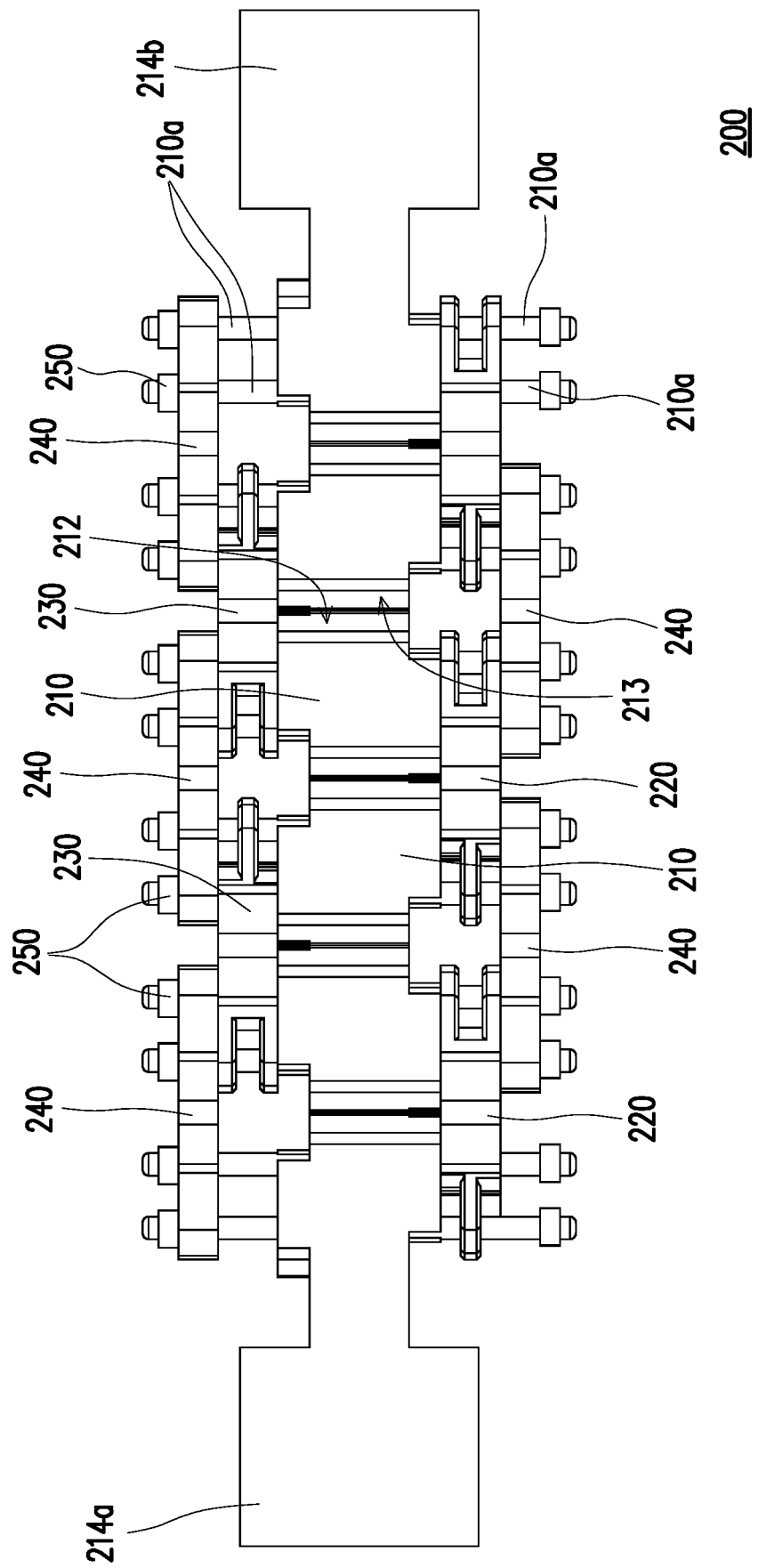
FIG. 4C is a schematic partial bottom view of the hinge structure of FIG. 4A.

FIG. 3A is a schematic partial side view of the foldable electronic device in a bent and folded state according to another embodiment of the present disclosure. FIG. 3B is a schematic partial side view showing the foldable electronic device of FIG. 3A switched to the unfolded state. FIG. 4A is a schematic partial view of the hinge structure of FIG. 3B. FIG. 4B is a schematic partial exploded view of the hinge structure of FIG. 4A. FIG. 4C is a schematic partial bottom view of the hinge structure of FIG. 4A. For convenience of illustration, the first casing 11 and the second casing 12 in the drawing are shown by dashed lines.

First, referring to FIG. 3A and FIG. 3B, in the embodiment, the foldable electronic device 10A can be integrated into a smart phone, a tablet computer, a notebook computer or a display, wherein the foldable electronic device 10A includes the first casing 11, the second casing 12, the foldable display 13 and a hinge structure 200, and the hinge structure 200 is disposed between the first casing 11 and the second casing 12. The hinge structure 200 is configured to connect the first casing 11 and the second casing 12, wherein the first casing 11 and the second casing 12 not only can be rotated relatively through the hinge structure 200 but also can generate movement in the horizontal direction HD by being driven through the hinge structure 200.

Specifically, the foldable display 13 includes the first bonding portion 13a, the second bonding portion 13b, and the foldable portion 13c. The first bonding portion 13a is secured to the first casing 11, and the second bonding portion 13b is secured to the second casing 12. The foldable portion 13c is located between the first bonding portion 13a and the second bonding portion 13b, and is aligned with the hinge structure 200. For example, the foldable display 13 is designed to be folded outward, so the foldable portion 13c is located right above the hinge structure 200, and the display surface 13d of the foldable display 13 always faces outward regardless of whether the foldable display 13 is in a folded state or an unfolded state.

As shown in FIG. 3A, the hinge structure 200 is in a folded state and has an arc-like structure. Since the foldable portion 13c is supported by the hinge structure 200, the foldable portion 13c is folded in conformity with the geometrical contour of the hinge structure 200. As shown in FIG. 3B, the hinge structure 200 is in an unfolded state, and has a beam-like structure. Since the foldable portion 13c is supported by the hinge structure 200, the foldable portion 13c is flatly unfolded in conformity with the geometrical contour of the hinge structure 200.

Further, during the transition of the hinge structure 200 from the folded state to the unfolded state, in the horizontal direction HD, the distance between both ends of the hinge structure 200 is gradually increased, and the distance between the first casing 11 secured to one of the two ends and the second casing 12 secured to the other end is also gradually increased. Accordingly, the foldable portion 13c is pulled by the first casing 11 and the second casing 12 to be flatly unfolded, so that the unfolded foldable display 13 has good flatness. Conversely, during the transition of the hinge structure 200 from the unfolded state to the folded state, in the horizontal direction HD, the distance between both ends of the hinge structure 200 is gradually reduced, and the distance between the first casing 11 secured to one of the two ends and the second casing 12 secured to the other end is also gradually reduced. Accordingly, the foldable portion 13c is squeezed by the first casing 11 and the second casing 12 and pushed by the hinge structure 200 to become folded.

Next, referring to FIG. 3A to FIG. 4C, in the present embodiment, the hinge structure 200 includes a plurality of supporting blocks 210, a plurality of first hinge blocks 220, and a plurality of second hinge blocks 230, wherein the supporting blocks 210 are arranged side by side between the first casing 11 and the second casing 12, and the first hinge blocks 220 and the second hinge blocks 230 are respectively arranged on both sides of the supporting blocks 210. Specifically, the number of the first hinge blocks 220 may be larger than the number of the second hinge blocks 230, and the structural design of the first hinge blocks 220 is the same as the structural design of the second hinge blocks 230. The first hinge blocks 220 and the second hinge blocks 230 are arranged in misalignment. If two adjacent supporting blocks 210 are regarded as one set, the previous set of two supporting blocks 210 is connected through one of the first hinge blocks 220, and the next set of two supporting blocks 210 is connected through one of the second hinge blocks 230.

Each of the first hinge blocks 220 can be roughly divided into two halves, wherein the two halves are respectively overlapped with two adjacent supporting blocks 210, and the two halves rotatably and slidably connect the two adjacent supporting blocks 210 respectively. On the other hand, each of the second hinge blocks 230 can be roughly divided into two halves, wherein the two halves are respectively overlapped with the two adjacent supporting blocks 210, and the two halves rotatably and slidably connect the two adjacent supporting blocks 210 respectively. That is, the two adjacent supporting blocks 210 can be rotated and slid relative to each other through one of the first hinge blocks 220 or one of the second hinge blocks 230 to move closer to or be separated from each other.

Each of the supporting blocks 210 has a supporting plane 211, and the foldable portion 13c of the foldable display 13 contacts the supporting planes 211 of the supporting blocks 210. As shown in FIG. 3A, the hinge structure 200 is in a folded state, and any two adjacent supporting blocks 210 abut against each other, so that the supporting planes 211 form an arc-like surface. Since the foldable portion 13c is supported by the supporting planes 211 of the supporting blocks 210, the foldable portion 13c is folded in conformity with the arc-like surface formed by the supporting planes 211.

The supporting block 210 of one of the two adjacent supporting blocks 210 has a first slope 212, and the other of the two adjacent supporting blocks 210 has a second slope 213 opposite to the first slope 212. On the other hand, the first slope 212 and the second slope 213 of each supporting block 210 are respectively connected to both sides of the supporting plane 211. In the unfolded state shown in FIG. 3B, the first slope 212 of one of the two adjacent supporting blocks 210 is separated from the second slope 213 of the other of the two adjacent supporting blocks 210, and the normal vector of the first slope 212 intersects with the normal vector of the second slope 213. In the folded state shown in FIG. 3A, the first slope 212 of one of the two adjacent supporting blocks 210 completely abuts against the second slope 213 of the other of the two adjacent supporting blocks 210, and the normal vector of the first slope 212 is parallel to the normal vector of the second slope 213.

That is, in the geometrical contour, the first slope 212 of one of the two adjacent supporting blocks 210 and the second slope 213 of the other of the two adjacent supporting blocks 210 match each other. Accordingly, after the hinge structure 200 is switched to the folded state, the supporting planes 211 can form an arc-like surface, so that the folded foldable portion 13c has a smooth curvature.

In this embodiment, each of the first hinge blocks 220 and each of the second hinge blocks 230 have two first sliding slots 210 disposed symmetrically and two second sliding slots 202 symmetrically disposed between the two first sliding slots 201, and the movement route and the rotation route of the supporting blocks 210 are determined by the first sliding slots 201 and the second sliding slots 202 of the first hinge blocks 220 and the second hinge blocks 230. Specifically, each of the supporting blocks 210 includes a plurality of shaft portions 210a. In each of the supporting blocks 210, two of the shaft portions 210a are disposed in sets and protrude from one side of the supporting block 210, and the other two of the shaft portions 210a are disposed in sets and protrude from the other side of the supporting block 210. It should be noted that the two shaft portions 210a arranged in sets are arranged side by side.

If two adjacent supporting blocks 210 are regarded as one set, the previous set of two supporting blocks 210 is connected through one of the first hinge blocks 220, and the next set of two supporting blocks 210 is connected through one of the second hinge blocks 230. With respect to the previous set of the two supporting blocks 210, two of the four shaft portions 210a respectively pass through the two second sliding slots 202 of one of the first hinge blocks 220, and the other two of the four shaft portions 210a respectively pass through the two first sliding slots 201 of one of the first hinge blocks 220. With respect to the next set of the two supporting blocks 210, two of the four shaft portions 210a respectively pass through the two second sliding slots 202 of one of the second hinge blocks 230, and the other two of the four shaft portions 210a respectively pass through the two first sliding slots 201 of one of the second hinge blocks 230. Accordingly, the two adjacent supporting blocks 210 can be rotated and slid relative to each other through the engagement of the two shaft portions 210a and the two first sliding slots 201 as well as the engagement of the other two shaft portions 210a and the two second sliding slots 202.

On the other hand, in the two adjacent supporting blocks 210, the two second sliding slots 202 are closer to the rotation reference of the two supporting blocks 210 than the two first sliding slots 201, so the length of each of the first sliding slots 201 is designed to be larger than the length of each of the second sliding slots 202 to compensate for the difference in rotation and sliding routes between the two shaft portions 210a in the same set.

Taking any of the first hinge blocks 220 or any of the second hinge blocks 230 as an example, in the folded state shown in FIG. 3A, the two shaft portions 210a are respectively located at the inner end of the two first sliding slots 201, and the other two shaft portions 210a are respectively located at the inner end of the two second sliding slots 202. Conversely, in the unfolded state shown in FIG. 3B, the two shaft portions 210a are respectively located at the outer end of the two first sliding slots 201, and the other two shaft portions 210a are respectively located at the outer end of the two second sliding slots 202. Specifically, one end of each of the first sliding slots 201 close to the geometric center of the corresponding first hinge block 220 or the corresponding second hinge block 230 is regarded as an inner end, and the other end of each of the second sliding slots 202 away from the geometric center of the corresponding first hinge block 220 or the corresponding second hinge block 230 is regarded as the outer end.

In the present embodiment, the hinge structure 200 further includes a plurality of positioning plates 240, wherein a portion of the positioning plates 240 is located at one side of the first hinge blocks 220, and the first hinge blocks 220 are located between a portion of the positioning plates 240 and the supporting blocks 210. The other portion of the positioning plates 240 is located on one side of the second hinge blocks 230, and the second hinge blocks 230 are located between the other portion of the positioning plates 240 and the supporting blocks 210. Specifically, the positioning plates 240 can be configured to position the first hinge blocks 220 and the second hinge blocks 230 and ensure that the first hinge blocks 220 and the second hinge blocks 230 are in contact with the supporting blocks 210.

Each of the positioning plates 240 has two first positioning sliding slots 241 disposed symmetrically and two second positioning sliding slots 242 disposed symmetrically between the two first positioning sliding slots 241, wherein each positioning plate 240 can be roughly divided into two halves, and each of the halves is provided with one of the first positioning sliding slots 241 and one of the second positioning sliding slots 242. With respect to at least one of the positioning plates 240, one half of the positioning plate 240 is overlapped with one of the first hinge blocks 220 or one of the second hinge blocks 230. With respect to at least one of the positioning plates 240, the two halves of the positioning plate 240 are respectively overlapped with the two adjacent first hinge blocks 220 or the two adjacent second hinge blocks 230. In the two adjacent supporting blocks 210, two of the four shaft portions 210a respectively pass through the two first positioning sliding slots 241 of one positioning plate 240, and the other two of the four shaft portions 210a respectively pass through the two second positioning sliding slots 242 of one positioning plate 240.

With respect to the positioning plates 240 that overlap with the first hinge blocks 220 or the positioning plates 240 that overlap with the second hinge blocks 230, the first positioning sliding slots 241 are overlapped with the second sliding slots 202, and the second positioning sliding slots 242 are overlapped with the first sliding slots 201. Further, the shaft portions 210a passing through the second sliding slots 202 further pass through the first positioning sliding slots 241, and the shaft portions 210a passing through the first sliding slots 201 further pass through the second positioning sliding slots 242.

In the two adjacent first hinge blocks 220, the two second positioning sliding slots 242 are closer to the rotation reference of the two first hinge blocks 220 than the two first positioning sliding slots 241, so the length of each of the first positioning sliding slots 241 is designed to be larger than the length of each of the second positioning sliding slots 242 to compensate for the difference in rotation and sliding routes between the two shaft portions 210a in the same set. In the two adjacent second hinge blocks 230, the two second positioning sliding slots 242 are closer to the rotation reference of the two second hinge blocks 230 than the two first positioning sliding slots 241, so the length of each of the first positioning sliding slots 241 is designed to be larger than the length of each of the second positioning sliding slots 242 to compensate for the difference in rotation and sliding routes between the two shaft portions 210a in the same set.

In the present embodiment, the hinge structure 200 further includes a plurality of axle sleeves 250, wherein the end of each of the shaft portions 210a is sleeved with one of the axle sleeves 250, and the axle sleeves 250 are configured to position the first hinge blocks 220, the second hinge blocks 230 and the positioning plates 240. Further, a portion of the positioning plates 240 are positioned between a portion of the axle sleeves 250 and the first hinge blocks 220, and the other portion of the positioning plates 240 are positioned between the other portion of the axle sleeves 250 and the second hinge blocks 230. On the other hand, a portion of the positioning plates 240 and the first hinge blocks 220 are positioned between a portion of the axle sleeves 250 and the supporting blocks 210, and the other portion of the positioning plates 240 and the second hinge blocks 230 are positioned between the other portion of the axle sleeves 250 and the supporting blocks 210.

For example, the axle sleeves 250 can be configured to provide the positioning torque for the shaft portions 210a to allow the hinge structure 200 to be temporarily fixed in the folded state, the unfolded state or a transition state between the folded state and the unfolded state.

In this embodiment, two of the supporting blocks 210 are respectively connected to the first casing 11 and the second casing 12, wherein the supporting block 210 connected to the first casing 11 has a first connecting portion 214a, and the other supporting block 210 connected to the second casing 12 has a second connecting portion 214b. On the other hand, each of the supporting blocks 210 includes a gear portion 215, wherein the number of the gear portion 215 is two and the gear portions 215 protrude from both sides of the supporting block 210, respectively. Each of the first hinge blocks 220 and each of the second hinge blocks 230 include two synchronous gear portions 203 disposed symmetrically to engage with the gear portions 215 of the supporting blocks 210.

In the two adjacent supporting blocks 210, the gear portion 215 of one of the supporting blocks 210 is adjacent to the gear portion 215 of the other of the supporting blocks 210, and the two synchronous gear portions 203 of one of the first hinge blocks 220 are respectively engaged with the aforementioned two gear portions 215. Based on the design that the two synchronous gear portions 203 of the first hinge block 220 respectively engage with the two gear portions 215 of the two adjacent supporting blocks 210, and the two adjacent supporting blocks 210 can be rotated and moved in two different directions, and the rotation and movement of the two adjacent supporting blocks 210 are synchronized, so it can be ensured that the rotation amount and movement amount of the two supporting blocks 210 are consistent.

In the two adjacent supporting blocks 210, the gear portion 215 of one of the supporting blocks 210 is adjacent to the gear portion 215 of the other supporting block 210, and the two synchronous gear portions 203 of one of the second hinge blocks 230 are respectively engaged with the aforementioned two gear portions 215. Based on the design that the two synchronous gear portions 203 of the second hinge block 230 respectively engage with the two gear portions 215 of the two adjacent supporting blocks 210, and the two adjacent supporting blocks 210 can be rotated and moved in two different directions, and the rotation and movement of the two adjacent supporting blocks 210 are synchronized, so it can be ensured that the rotation amount and movement amount of the two supporting blocks 210 are consistent.

In summary, the hinge structure of the foldable electronic device of the present disclosure can be switched between a folded state and an unfolded state, and the foldable display can be folded or flatly unfolded by being driven through the hinge structure. Specifically, the hinge structure includes a plurality of supporting blocks and a plurality of hinge blocks, wherein each of the hinge blocks is configured to connect two adjacent supporting blocks, and one hinge block and one supporting block connected to each other has a degree of movement freedom for rotating and sliding relative to each other. Therefore, in the process that the hinge structure is transitioned from the folded state to the unfolded state, the hinge structure can generate a movement route in the horizontal direction, and the foldable display is driven accordingly to be flatly unfolded, such that the foldable display switched to the unfolded state has good flatness.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A foldable electronic device, comprising:
    a first casing;
    a second casing;
    a hinge structure disposed between the first casing and the second casing and connecting the first casing and the second casing, wherein the hinge structure comprises:
        a plurality of supporting blocks arranged side by side between the first casing and the second casing, wherein each of the supporting blocks comprises two shaft portions arranged side by side;
        a plurality of first hinge blocks arranged on one side of the supporting blocks, wherein the two adjacent supporting blocks are connected to each other through one of the first hinge blocks, and the first hinge blocks rotatably and slidably connect the supporting blocks, wherein each of the first hinge blocks has two first sliding slots disposed symmetrically and two second sliding slots disposed symmetrically between the two first sliding slot; and
        a plurality of second hinge blocks arranged on the other side of the supporting blocks, wherein the two adjacent supporting blocks are connected to each other through one of the second hinge blocks, and the second hinge blocks rotatably and slidably connect the supporting blocks, wherein each of the second hinge blocks has two first sliding slots disposed symmetrically and two second sliding slots disposed symmetrically between the two first sliding slot,
        in the two adjacent supporting blocks, two of the four shaft portions respectively pass through the two first sliding slots of one of the first hinge blocks, and the other two of the four shaft portions respectively pass through the two second sliding slots of one of the first hinge blocks,
        in the other two of the adjacent supporting blocks, two of the four shaft portions respectively pass through the two first sliding slots of one of the second hinge blocks, and the other two of the four shaft portions respectively pass through the two second sliding slots of one of the second hinge blocks; and
    a foldable display comprising a first bonding portion secured to the first casing, a second bonding portion secured to the second casing, and a foldable portion located between the first bonding portion and the second bonding portion, wherein the foldable portion is aligned with the hinge structure.

2. The foldable electronic device according to claim 1, wherein each of the supporting blocks has a supporting plane, and the foldable portion of the foldable display contacts the supporting planes of the supporting blocks.

3. The foldable electronic device according to claim 1, wherein in the two adjacent supporting blocks, one of the supporting blocks has a first slope, and the other of the supporting blocks has a second slope opposite to the first slope, the first slope is separated from or abuts against the second slope.

4. The foldable electronic device according to claim 1, wherein in the two adjacent supporting blocks, one of the supporting blocks has a first slope and the other of the supporting blocks has a second slope opposite to the first slope, the normal vector of the first slope intersects or is parallel to the normal vector of the second slope.

5. The foldable electronic device according to claim 1, wherein two of the supporting blocks are respectively connected to the first casing and the second casing, wherein one of the supporting blocks connected to the first casing has a first connecting portion, and the other of the supporting blocks connected to the second casing has a second connecting portion.

6. The foldable electronic device according to claim 1, wherein the hinge structure further comprises a plurality of positioning plates, the first hinge blocks are located between a portion of the positioning plates and the supporting blocks, and the second hinge blocks are located between the other portion of the positioning plates and the supporting blocks, and each of the positioning plates has two first positioning sliding slots disposed symmetrically and two second positioning sliding slots disposed symmetrically between the two first positioning sliding slots, in the two adjacent supporting blocks, two of the four shaft portions respectively pass through the two first positioning sliding slots of one of the positioning plates, and the other two of the four shaft portions respectively pass through the two second positioning sliding slots of one of the positioning plates.

7. The foldable electronic device according to claim 6, wherein the hinge structure further comprises a plurality of axle sleeves sleeved on the shaft portions, and the axle sleeves are configured to position the first hinge blocks, the second hinge blocks and the positioning plates.

8. The foldable electronic device according to claim 1, wherein each of the supporting blocks comprises a gear portion, and each of the first hinge blocks and each of the second hinge blocks comprise two synchronous gear portions disposed symmetrically, in the two adjacent supporting blocks, the gear portion of one of the supporting blocks is adjacent to the gear portion of the other of the supporting blocks, and the two synchronous gear portions of one of the first hinge blocks or the two synchronous gear portions of one of the second hinge blocks respectively engage with the two gear portions.

\* \* \* \* \*